(12) United States Patent
Chung

(10) Patent No.: US 8,975,140 B2
(45) Date of Patent: Mar. 10, 2015

(54) SEMICONDUCTOR DEVICE HAVING PASSING GATE AND METHOD FOR FABRICATING THE SAME

(71) Applicant: SK Hynix Inc., Icheon (KR)

(72) Inventor: Woo Young Chung, Yongin (KR)

(73) Assignee: SK Hynix Inc., Icheon (KR)

(*) Notice: Subject to any disclaimer, the term of this patent is extended or adjusted under 35 U.S.C. 154(b) by 0 days.

(21) Appl. No.: 14/167,849

(22) Filed: Jan. 29, 2014

(65) Prior Publication Data

US 2015/0035022 A1 Feb. 5, 2015

(30) Foreign Application Priority Data

Jul. 31, 2013 (KR) .......................... 10-2013-0090876

(51) Int. Cl.
*H01L 21/336* (2006.01)
*H01L 29/78* (2006.01)
*H01L 21/762* (2006.01)

(52) U.S. Cl.
CPC .......... *H01L 29/78* (2013.01); *H01L 21/76224* (2013.01)
USPC ........................................................ 438/270

(58) Field of Classification Search
CPC .............. H01L 29/78; H01L 21/76224; H01L 29/666666; H01L 29/66704; H01L 29/4236
USPC ........... 438/44, 270, 430, 151, 197, 199, 585; 257/262, 368, 369, 330, 374, 520
See application file for complete search history.

(56) References Cited

U.S. PATENT DOCUMENTS

| | | | |
|---|---|---|---|
| 7,872,313 B2 * | 1/2011 | Jung | 257/374 |
| 8,518,779 B2 * | 8/2013 | Lee et al. | 438/270 |
| 2007/0042583 A1 * | 2/2007 | Jang et al. | 438/585 |
| 2010/0219467 A1 * | 9/2010 | Kim | 257/330 |
| 2011/0186924 A1 * | 8/2011 | Chun | 257/331 |
| 2013/0087853 A1 * | 4/2013 | Kim | 257/330 |
| 2014/0077294 A1 * | 3/2014 | Hwang et al. | 257/330 |
| 2014/0110786 A1 * | 4/2014 | Kim et al. | 257/365 |
| 2014/0133254 A1 * | 5/2014 | Kim et al. | 365/201 |

FOREIGN PATENT DOCUMENTS

| | | |
|---|---|---|
| KR | 10-2009-0032879 A | 4/2009 |
| KR | 10-2011-0090579 A | 8/2011 |
| KR | 10-2011-0130153 A | 12/2011 |

* cited by examiner

*Primary Examiner* — Jarrett Stark
*Assistant Examiner* — Shahed Ahmed

(57) ABSTRACT

A semiconductor device includes passing gates. In the semiconductor device, a passing gate formed in a device isolation film is vertically positioned at a deeper and lower level than an operation gate formed in an active region defined by the device isolation film such that the passing gate does not overlap with a junction region. A step difference is formed in a storage node junction region, and thus a contact area between a storage node contact and the storage node junction region is increased, resulting in the improvement of operational characteristics of the semiconductor device.

8 Claims, 10 Drawing Sheets

SEMICONDUCTOR DEVICE HAVING PASSING GATE AND METHOD FOR FABRICATING THE SAME

CROSS-REFERENCE TO RELATED APPLICATION

The priority of Korean patent application No. 10-2013-0090876 filed on 31 Jul. 2013, the disclosure of which is hereby incorporated in its entirety by reference, is claimed.

BACKGROUND OF THE INVENTION

Embodiments of the present invention relate to a semiconductor device and a method for fabricating the same, and more particularly to a semiconductor device having passing gates and a method for fabricating the same.

With the increasing development of semiconductor fabrication technology, semiconductor devices can be fabricated to be smaller in size and highly integrated. Specifically, as semiconductor devices are rapidly developing to implement higher levels of integration, a preferred cell layout is rapidly changing from an $8F^2$ structure to a $6F^2$ structure.

As the degree of integration of the semiconductor device increases, the distance between a gate (word line) coupled to a cell transistor and a bit line coupled to the cell transistor is gradually reduced. As a result, the capacitance between the bit line and the gate may increase such that the operational reliability of the semiconductor device is likely to deteriorate. In order to improve the operational reliability of smaller and highly integrated semiconductor devices, a buried gate structure has been proposed in which a gate is buried within a semiconductor substrate. For example, the conventional buried gate structure described above can be incorporated within a semiconductor device having a $6F^2$ layout, and can include a metal film formed as a gate electrode to reduce the degree of gate-electrode resistance as a compensating modification.

However, the conventional buried gate structure has an overlap region in which a junction overlaps with a gate, resulting in a Gate Induced Drain Leakage (GIDL) caused by a leakage current from the overlap region. If a gate of a cell array of the semiconductor device is formed as a line type, a gate region (defined as a region incorporating one or more "passing gates") is buried in a device isolation film defining an active region, and this film-isolated gate region may be formed adjacently to the active region of such a semiconductor device. The passing gates may facilitate the occurrence of GIDL. The GIDL discharges the stored charges in the cell array, and deteriorates retention characteristics (i.e., refresh characteristics) of the semiconductor device.

BRIEF SUMMARY

Embodiments of the present invention are directed to a semiconductor device incorporating passing gates and a method for fabricating the same, which substantially obviate one or more problems due to limitations and disadvantages of the related art.

Embodiments of the present invention relate to a semiconductor device in which a junction region is spaced apart and structurally isolated from a passing gate based on several structural and configurational modifications presented herein, and relate to a method for fabricating the same, so as to prevent the deterioration of performance characteristics due to a passing gate effect.

An embodiment of the present invention relates to a semiconductor technology for improving operational characteristics of semiconductor devices by increasing a contact area between a junction region and a storage node contact (SNC).

In accordance with one aspect of the embodiment, a method for forming a semiconductor device includes: forming a device isolation film defining an active region in a substrate; forming an insulation film pattern defining a gate region over the active region and the device isolation film; forming trenches by etching the active region and the device isolation film using the insulation film pattern as an etch mask; forming a gate conductive film to fill the trenches as well as to be over the insulation film pattern; removing the gate conductive film formed over a passing gate region until the insulation film pattern is exposed, wherein the gate conductive film formed over a operation gate region is remained over the insulation film pattern; and etching the gate conductive film in a manner that an operation gate is positioned higher than a position of a passing gate.

In accordance with another aspect of the embodiment, a semiconductor device includes: an active region defined by a device isolation film and having a step difference; an operation gate disposed within the active region; and a passing gate disposed within the device isolation film, wherein a top surface of the passing gate is located at a lower level than a top surface of the operation gate.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
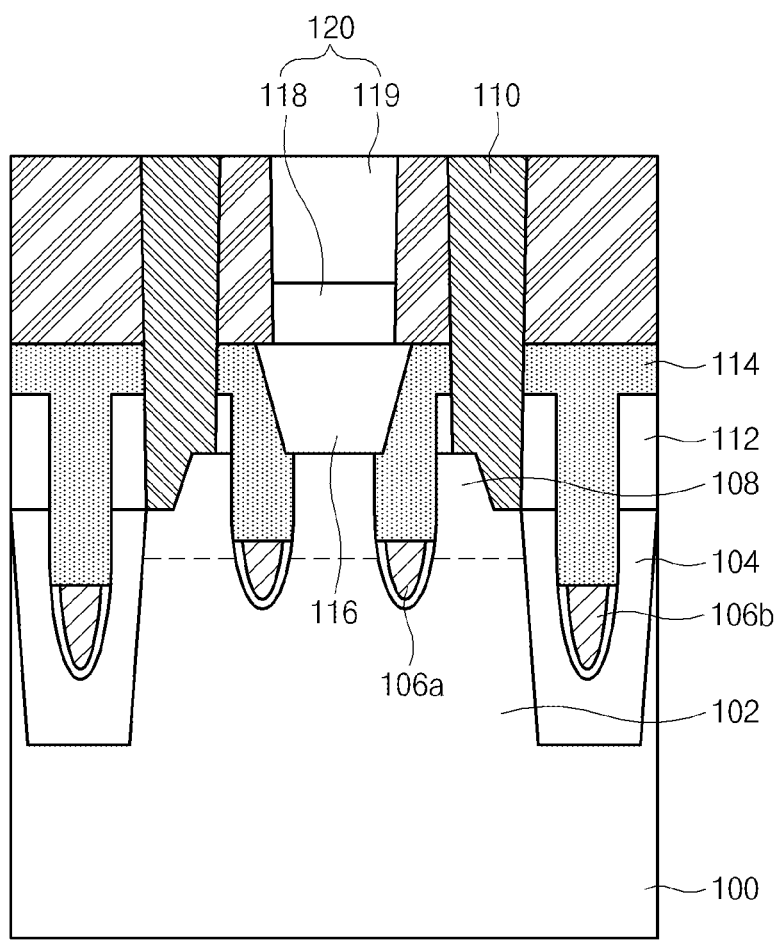
FIG. 1 is a cross-sectional view illustrating a semiconductor device according to an embodiment of the present invention.

FIG. 1 is a cross-sectional view illustrating a semiconductor device according to an embodiment of the present invention.

Referring to FIG. 1, an active region 102 of the semiconductor device is defined by a device isolation film 104 formed in a substrate 100, and a plurality of gates, e.g., 106a and 106b, are formed to be buried within the active region 102 and the device isolation film 104, to be referenced generally as "buried gates." In an embodiment, the buried gates 106a and 106b are formed of a metal material, for example, titanium (Ti), titanium nitride (TiN), tantalum nitride (TaN), tungsten (W), tungsten nitride (WN), or an equivalent. In a gate region in which the gates 106a and 106b are buried, the active region 102 is more elevated than the device isolation film 104 such that the active region 102 is formed as a fin structure.

FIG. 1 represents a finished product fabricated by a method further described and illustrated in FIGS. 2-9. In FIG. 1, an operation gate buried in the active region 102, e.g., the buried gate 106a, is shown to be vertically positioned higher than the position of a passing gate buried in the device isolation film 104, e.g., the buried gate 106b. The operation gate 106a is formed to overlap with the positioning of a storage node (SN) junction 108 formed in the active region 102. In contrast, the passing gate 106b is vertically positioned to be lower than the position of the operation gate 106a, in order to avoid overlapping with the SN junction 108 situated within the contiguous active region 102. As a result, an off-leakage that may be caused by a passing gate effect can be prevented from occurring at the passing gate 106b.

In accordance with an embodiment, a step difference may occur in the SN junction 108 in the active region 102. If the step difference occurs, a contact region between the SN junction 108 and a storage node contact (SNC) 110 increases in size, resulting in reduction of contact resistance.

A pad insulation film pattern 112 for defining trenches is formed over the active region 102 and the device isolation film 104. Here, the gates 106a and 106b are buried in the trenches that are formed by etching the active region 102 and the device isolation film 104 using the pad insulation film pattern 112. A sealing film 114 is formed over the gates 106a and 106b to insulate the gates 106a and 106b.

The sealing film 114 is also formed over the pad insulation film 112. In accordance with an embodiment, the pad insulation film 112 and the sealing film 114 are used as an interlayer insulation film for forming a bit-line contact hole. That is, instead of forming a separate interlayer insulation film to form a contact hole in which a bit line contact 116 is buried, the pad insulation film 112 and the sealing film 114 are used as the interlayer insulation film, resulting in simplified fabrication.

A bit line pattern 120 is formed to include a conductive film pattern 118 and a hard mask pattern 119 that are stacked over the bit-line contact 116.

FIGS. 2 to 9 are cross-sectional views illustrating a method for fabricating the semiconductor device of FIG. 1 according to an embodiment of the present invention.

Figure 2:
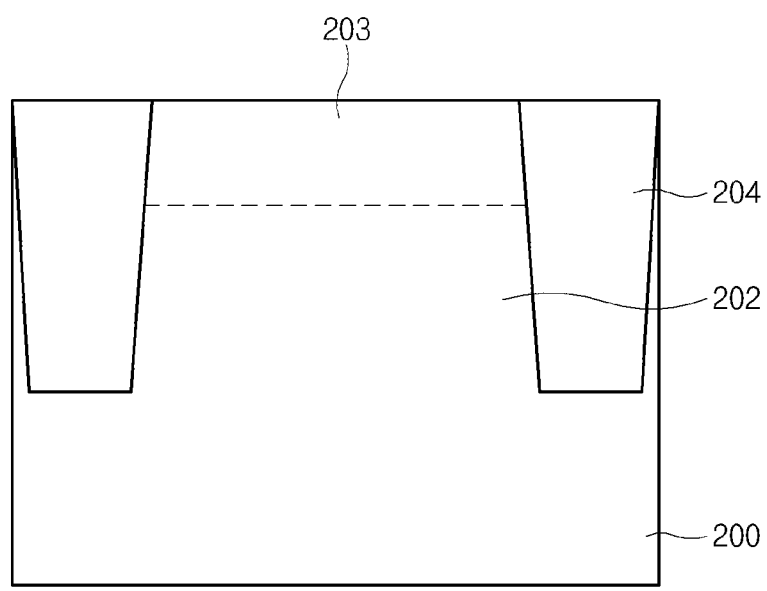
FIGS. 2 to 9 are cross-sectional views illustrating a method for fabricating the semiconductor device of FIG. 1 according to an embodiment of the present invention.

Referring to FIG. 2, a pad oxide film (not shown) and a pad nitride film (not shown) are sequentially formed over a semiconductor substrate 200, and a hard mask pattern (not shown) for defining an active region 202 is formed over the pad nitride film. The hard mask pattern may be formed by forming a line-type pattern using a Spacer Pattern Technology (SPT) and then etching the line-type pattern in units of a predetermined length (active-region length) using a cut mask. Using the hard mask pattern, the active region 202 is formed to obliquely cross a bit line and a gate (word line) that are to be formed in subsequent processes.

The pad nitride film, the pad oxide film, and the semiconductor substrate 200 are sequentially etched using the hard mask pattern as an etch mask, such that a device-isolation trench (not shown) for defining the active region 202 is formed. The etching process may be a dry etching process.

Subsequently, a sidewall insulation film (not shown) is formed on a sidewall of the device-isolation trench. The sidewall insulation film may include an oxide film. The sidewall insulation film may be formed by depositing the oxide film on the sidewall of the device-isolation trench, or may be formed through a dry or wet oxidation process.

After that, a device-isolation insulation film is formed to fill the device-isolation trench and planarized until a top surface of the semiconductor substrate 200 is exposed. As a result, a device isolation film 204 is formed to define the active region 202. In an embodiment, the device isolation film 204 includes a spin on dielectric (SOD) material having superior gap-filling characteristics or a High Density Plasma (HDP) oxide film. In another embodiment, the device isolation film 204 is formed of a nitride film, or formed of a stacked structure of an oxide film and a nitride film. Subsequently, the pad oxide film and the pad nitride film are removed by etching processes, and then impurities are implanted into the active region 202 to form a junction region 203 (denoted by a dotted line).

Figure 3:
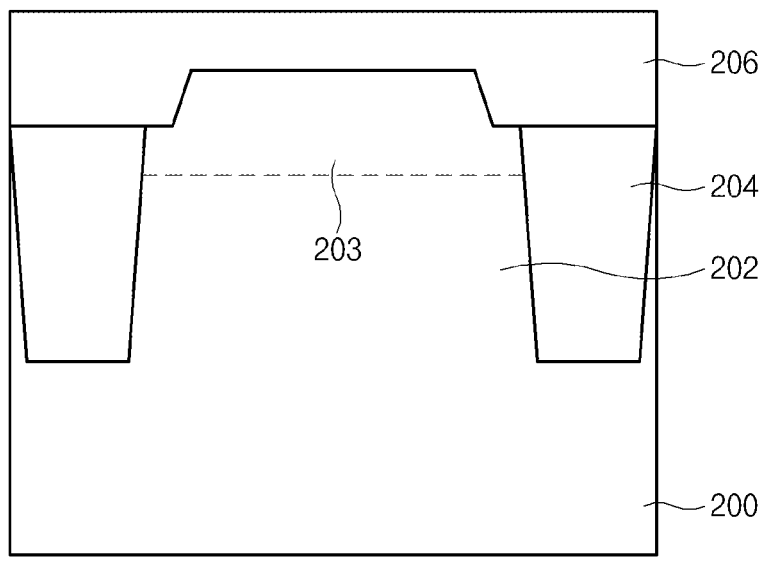

Referring to FIG. 3, an edge portion of the junction region 203, in which an SN junction is to be formed and a passing gate region in which a passing gate is to be formed in the device isolation film 204, is etched to a predetermined depth. As a result, a step difference is formed between the active region 202 and the device isolation film 204. The remaining portion of the junction region 203 where operation gates are to be formed protrudes from the device isolation film 204, such that the active region 202 including the junction region 203 has a hat structure.

Figure 10:
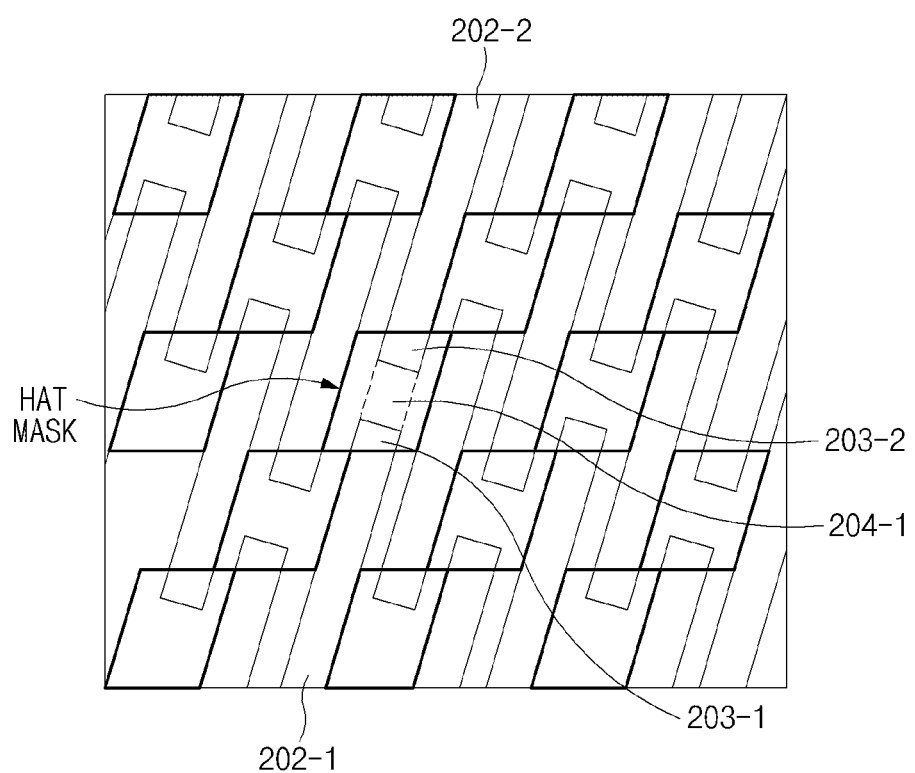
FIG. 10 shows a plane view of a semiconductor device according to an embodiment of the present invention.

For example, as shown in FIG. 10, an active region and a device isolation film are etched using a hat mask pattern, i.e., a mask pattern that results in an elevated portion with at least two adjacent portions provided at lower levels. Thus, in an embodiment, as a result of the hat mask pattern, a center region of the junction region is provided at a higher level than edge portions of the junction region. That is, the hat mask pattern is configured to open not only a passing gate region 204-1, which is disposed between two contiguous active regions 202-1 and 202-2 arranged along a long-axis direction of the active region, but also edge portions 203-1 and 203-2 of end parts in which SN junctions are to be formed in the active regions 202-1 and 202-2, respectively, resulting in the formation of a step difference between the active regions 202-1 and 202-2 and the device isolation film.

Subsequently, a pad insulation layer is formed over the active region 202 and the device isolation film 204 having a step difference therebetween, and the pad insulation layer is planarized to form a pad insulation film 206.

Figure 4:
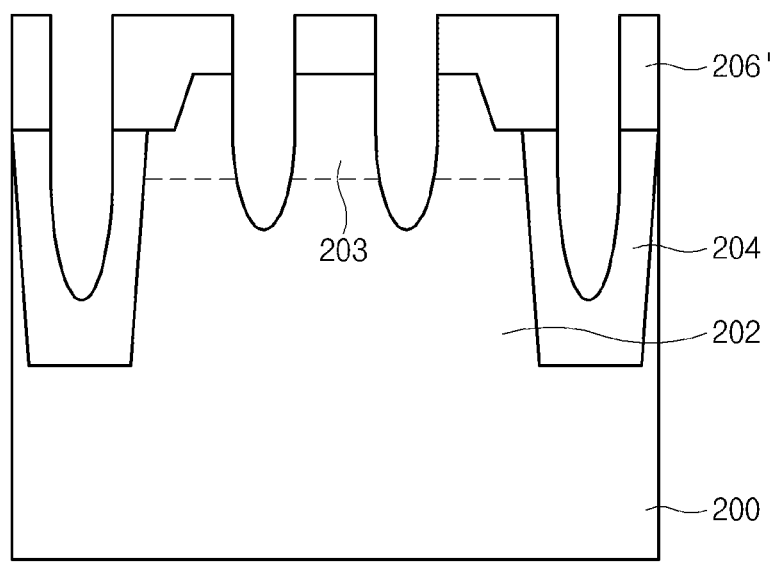

Referring to FIG. 4, a photoresist pattern (not shown) for defining a gate region is formed over the pad insulation film 206. The pad insulation film 206 is etched using the photoresist pattern as an etch mask to form a pad insulation film pattern 206'. The active region 202 and the device isolation film 204 are etched using the pad insulation film pattern 206' as an etch mask, such that a trench for forming a buried gate (word line) is formed.

Typically, since a gate is formed as a line type, the active region 202 and the device isolation film 204 are simultaneously etched to form a line-shaped trench. The device isolation film 204 may be more deeply etched than the active region 202 using etch selectivity. At this stage, the active region 202 is more elevated than the device isolation film 204, resulting in the formation of a fin structure.

Figure 5:
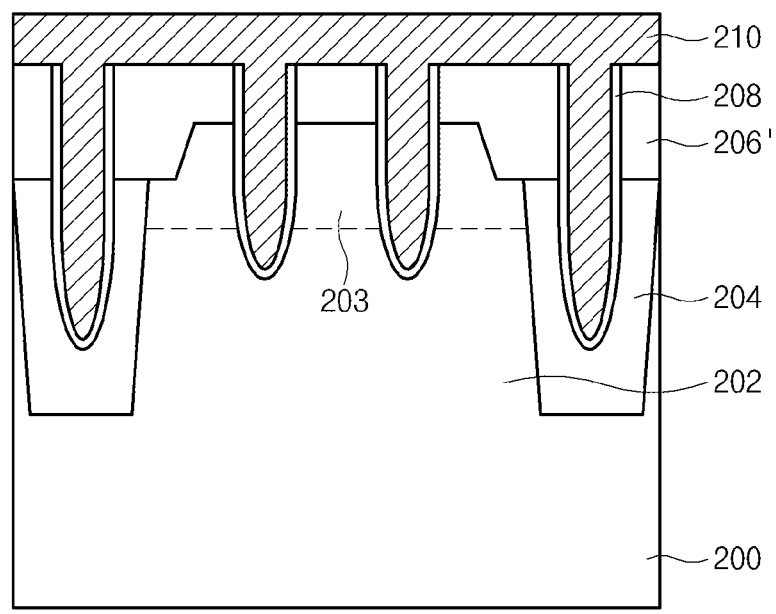

Referring to FIG. 5, an insulation film, e.g., oxide film, is deposited over the bottom and sidewalls of the trench to form a gate insulation film 208. In an embodiment, a portion of the semiconductor substrate 200 that is exposed by the trench is oxidized through an oxidation process, such that the gate insulation film 208 is formed.

Subsequently, a gate conductive film 210 is formed over the gate insulation film 208 to fill the trench. The gate conductive film 210 may also be formed over the pad insulation film pattern 206' at a predetermined thickness. The thickness of the gate conductive film 210 formed over the pad insulation film pattern 206' may vary according to differences in position (i.e., relative difference in depth) between the operation gate (positioned higher than the passing gate) and the passing gate (positioned lower than the operation gate).

The gate conductive film 210 may include one or more metal materials including titanium (Ti), titanium nitride (TiN), tantalum nitride (TaN), tungsten (W), tungsten nitride (WN), and the equivalent. In an embodiment, the gate conductive film 210 is formed by conformally depositing a TiN (or TaN) film to a thin thickness so as to reduce resistance and then forming a tungsten (W) film through gap-filling. In another embodiment, the gate conductive film 210 is formed by stacking the TiN film and the TaN film, or by sequentially stacking a TiN film, a TaN film, and a W film.

Figure 6:
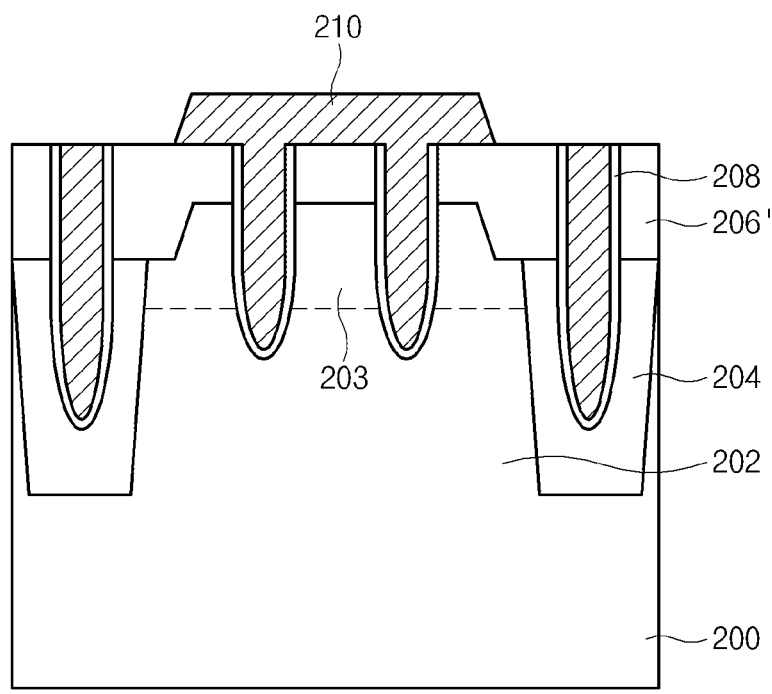

Referring to FIG. 6, the gate conductive film 210 formed over the pad insulation film pattern 206' is selectively etched using the hat mask of FIG. 10 to form a selectively etched gate conductive film 210. For example, the gate conductive film 210 disposed over a region in which the passing gate is to be formed is removed, such that a gate conductive film in a passing gate region of the device isolation film 204 and a gate conductive film in an operation gate region of the active region 202 are formed to have different heights.

Figure 7:
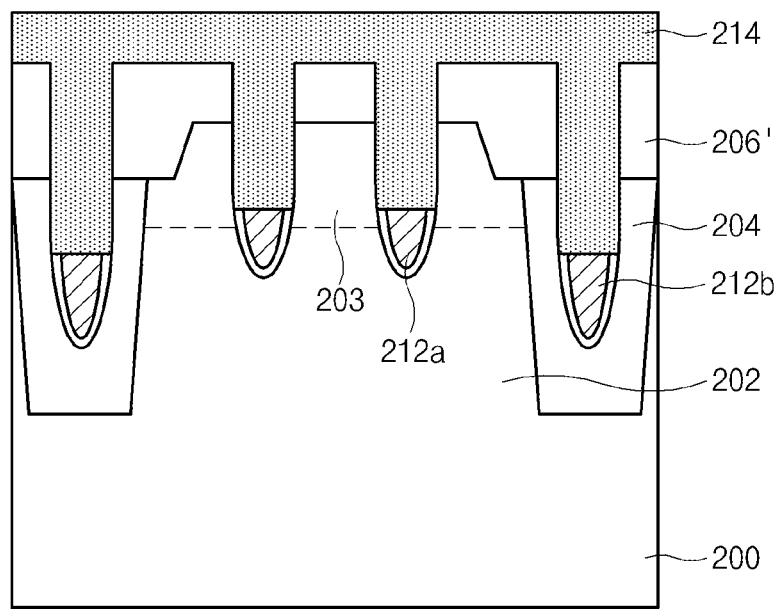

Referring to FIG. 7, the selectively etched gate conductive film 210 and the gate insulation film 208 are etched back to form buried gates 212a and 212b in a lower part of the trench. In this case, due to a difference in height between the gate conductive film in the passing gate region and the gate conductive film in the operation gate region, the whole or a part of the passing gate 212b is provided at a deeper position or a lower position than the operation gate 212a during the same etch-back process. As a result, the operation gate 212a is formed to partially overlap with the junction region 203, and the passing gate 212b is formed at a lower level than the bottom of the junction region 203. Therefore, the occurrence of a leakage current due to a passing gate effect is prevented.

Subsequently, a sealing film 214 is formed over the buried gates 212a and 212b and the pad insulation film pattern 206' to insulate the buried gates 212a and 212b. The sealing film 214 may include a nitride film.

Figure 8:
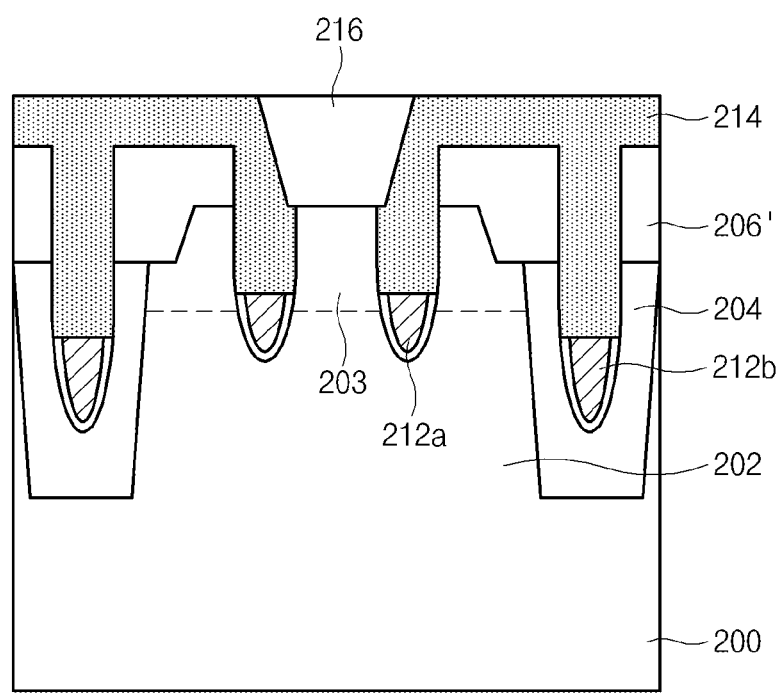

Referring to FIG. 8, a photoresist pattern (not shown) for defining a bit-line contact region is formed over the sealing film 214.

Subsequently, the sealing film 214 and the pad insulation film pattern 206' are etched using the photoresist pattern as an etch mask until the active region 202 is exposed. As a result, a bit-line contact hole is formed over a region between two adjacent operation gates in the active region 202.

After that, a conductive material is formed over the resultant structure including the bit-line contact hole to fill the bit-line contact hole and then planarized until the sealing film 214 is exposed, resulting in the formation of a bit-line contact 216. The conductive material may include polysilicon.

In accordance with the embodiment, the pad insulation film 206 and the sealing film 214 are used as an interlayer insulation film for forming the bit-line contact hole. Thus, it is possible to omit a process of forming a separate interlayer insulation film that is used for forming the bit line contact hole according to the related art.

Figure 9:
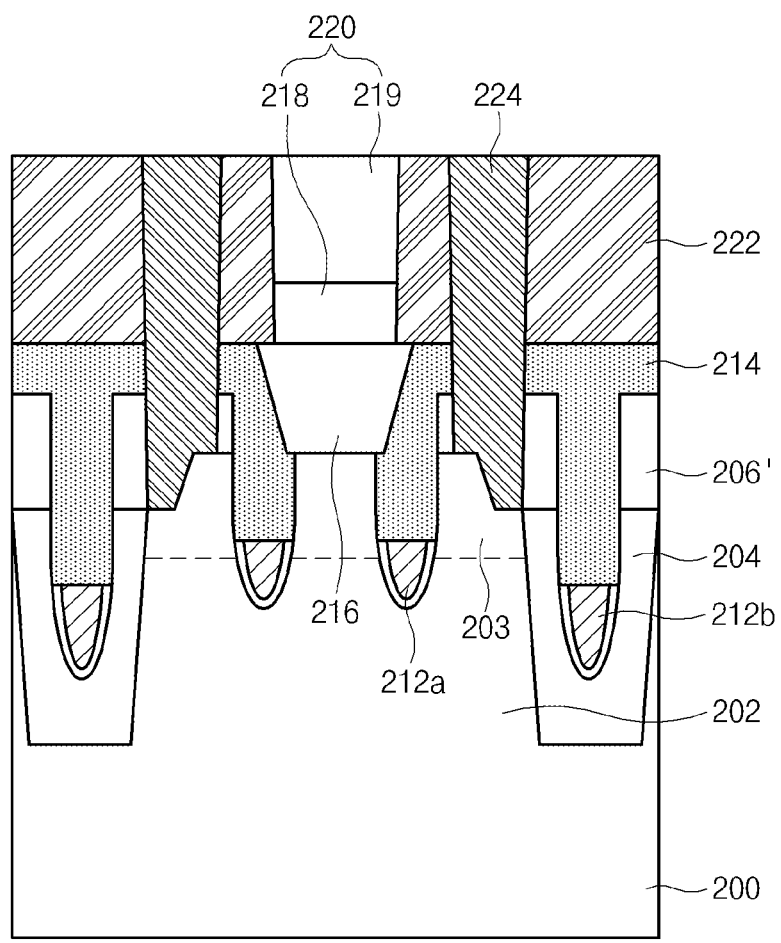

Referring to FIG. 9, a bit-line pattern 220 coupled to the bit-line contact 216 is formed over the bit-line contact 216.

In an embodiment, a barrier metal film (not shown), a bit-line conductive film (not shown), and a hard mask layer (not shown) are sequentially formed over the bit line contact 216 and the sealing film 214. Subsequently, a hard mask layer pattern 219 is formed by etching the hard mask layer using a mask defining a bit-line region, and the bit line conductive film and the barrier metal film are sequentially etched using the hard mask layer pattern 219 as a mask. As a result, the bit-line pattern 220 in which a barrier pattern (not shown), a bit-line conductive film pattern 218, and the hard mask pattern 219 are stacked is formed.

The barrier metal film may be formed of any one of titanium (Ti), titanium nitride (TiN), tungsten nitride (WN), tungsten silicon nitride (WSiN), and a stacked structure thereof. The bit-line conductive film may include tungsten (W). The hard mask layer may include any one of a nitride film, an amorphous carbon layer (ACL), a silicon oxynitride (SiON) film, and a stacked structure thereof.

Subsequently, an interlayer insulation layer is formed over the bit-line pattern 220 and the sealing film 214, and then planarized until the hard mask layer pattern 219 is exposed to form an interlayer insulation film 222. The interlayer insulation film 222 may include an oxide film.

After that, a storage node contact 224 is formed to be coupled to the junction region 203.

In accordance with an embodiment, after a mask pattern for defining a storage node contact region is formed over the interlayer insulation film 222, the interlayer insulation film 222, the sealing film 214, and the pad insulation film pattern 206' are etched using the mask pattern as an etch mask until the junction region 203 is exposed. As a result, a storage node contact hole is formed over a portion of the junction region 203 that has the step difference and is disposed between a region of the operation gate, e.g., 212a, and a region of the passing gate, e.g., 212b. Subsequently, a conductive material layer is formed to fill the storage node contact hole and then planarized to form the storage node contact 224.

As is apparent from the above description, in accordance with the embodiments of the present invention, it is possible to prevent the performance deterioration due to the passing gate effect by forming a passing gate whose top surface is located at a lower level than the bottom of the junction region 203.

In addition, it is possible to reduce contact resistance by increasing a contact area between the junction region 203 and the storage node contact 224 through the formation of the junction region 203 having the step difference. As a result, operational characteristics of the semiconductor device are improved.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device, the method comprising:

forming a device isolation film defining an active region in a substrate;

forming an insulation film pattern defining a gate region over the active region and the device isolation film;

forming trenches by etching the active region and the device isolation film using the insulation film pattern as an etch mask;

forming a gate conductive film to fill the trenches as well as to be over the insulation film pattern;

removing the gate conductive film formed over a passing gate region until the insulation film pattern is exposed, wherein the gate conductive film formed over an operation gate region is remained over the insulation film pattern; and etching the gate conductive film in a manner that an operation gate is positioned higher than a position of a passing gate.

2. The method according to claim 1, wherein an edge portion of the active region is etched to form a step difference at an end part of the active region in a long-axis direction, a portion of the end part, which is closer to the device isolation film, being the edge portion.

3. The method according to claim 2, wherein forming the step difference at an end part of the active region comprises:

selectively etching the end part of the active region where a storage node junction is to be formed using a hat mask configured to open the edge portion of the active region and a passing gate region of the device isolation film where the passing gate is to be formed.

4. The method according to claim 3, wherein removing the gate conductive film comprises:

selectively etching the gate conductive film using the hat mask.

5. The method according to claim 1, wherein forming the trenches comprises:

etching the device isolation film more deeply than the active region.

6. The method according to claim 1, further comprising, before forming the insulation film pattern, implanting impurities into the active region to form a junction region having a first depth.

7. The method according to claim 6, wherein the passing gate is formed so that a top surface of the passing gate is located at a lower level than a bottom of the junction region.

8. The method according to claim 1, further comprising:

forming a sealing film over the operation gate and the passing gate to cover the insulation film pattern;

selectively etching the sealing film and the insulation film pattern until the active region is exposed to form a bit-line contact hole over a region disposed between the operation gate and another operation gate adjacent to the operation gate; and filling the bit-line contact hole with a conductive material to form a bit-line contact.

* * * * *